United States Patent
Yokoyama et al.

[11] Patent Number: 5,248,576
[45] Date of Patent: Sep. 28, 1993

[54] METHOD OF PRODUCING COLOR FILTER USING A MICELLAR DISRUPTION METHOD

[75] Inventors: Seiichiro Yokoyama; Hideaki Kurata; Mitsuru Eida, all of Chiba, Japan

[73] Assignee: Idemitsu Kosan Co., Ltd., Tokyo, Japan

[21] Appl. No.: 689,877

[22] PCT Filed: Sep. 13, 1990

[86] PCT No.: PCT/JP90/01175

§ 371 Date: May 16, 1991

§ 102(e) Date: May 16, 1991

[87] PCT Pub. No.: WO91/04505

PCT Pub. Date: Apr. 4, 1991

[30] Foreign Application Priority Data

Sep. 18, 1989 [JP] Japan .................. 1-241084
May 7, 1990 [JP] Japan .................. 2-117131

[51] Int. Cl.⁵ .................. B44C 1/04; G02F 1/13
[52] U.S. Cl. .................. 430/7; 430/20; 430/257; 430/258; 430/320; 430/394; 359/85
[58] Field of Search .................. 430/7, 20, 257, 258, 430/320, 394, 271, 521; 350/339

[56] References Cited

U.S. PATENT DOCUMENTS

4,902,592  2/1990  Matsumura et al. .................. 430/7

FOREIGN PATENT DOCUMENTS

58-7608    1/1983   Japan.
60-5558    1/1985   Japan.
61-172103  8/1986   Japan.
62-136621  6/1987   Japan.
63-144305  6/1988   Japan.
63-243298  10/1988  Japan.

*Primary Examiner*—Marion E. McCamish
*Assistant Examiner*—S. Rosasco
*Attorney, Agent, or Firm*—Hidaka and Benman

[57] ABSTRACT

A process for producing color filters which enable a transparent electrode for forming a coloring matter film to be used as a transparent electrode for driving liquid crystals, and a resist for a light-shielding film used in this process for forming an insulating black matrix, is disclosed. The above production method comprises forming a black matrix over electrodes other than those corresponding to the individual separated colors and, at the same time, insulating layers as electrode contact window belts by utilizing the black matrix material; forming the electrode contact window belts by forming an electrically conductive layer over the black matrix so that they connect within each electrode contact window belt unit, but do not connect with those in different electrode contact window belt units; and forming a coloring matter layer by a micellar disruption method.

4 Claims, 4 Drawing Sheets

Resist for Light-Shielding Film

Light-Shielding Film

METHOD OF PRODUCING COLOR FILTER USING A MICELLAR DISRUPTION METHOD

TECHNICAL FIELD

The present invention relates to a method of producing a color filter having a coloring matter layer prepared by a micellar disruption method, and relates to a resist for a light-shielding film used in this method for forming a black matrix.

BACKGROUND ART

Heretofore, several methods of producing a color filter used for a display for a liquid crystal TV, a personal computer and the like, have been known. Such known methods include:

(1) a dyeing method which comprises dyeing a gelatin layer formed on a substrate, forming a photo-resist layer and curing the resist with a ultraviolet ray;

(2) a dispersion method which comprises dispersing a dye in a resist material, and then curing the resist material with the ultraviolet ray;

(3) a printing method which comprises directly printing a pattern for a coloring matter film and the like on a substrate; and (4) an electrolytic method which comprises forming a dispersion of a dye in a suitable solvent, and subjecting the dispersion to electrodepositing treatment utilizing an electrode formed on the substrate.

However, the above dyeing method (1) has a disadvantage in that the resultant filter has poor light resistance. The above dispersion method (2) shows a poor productivity due to a complexity of the steps. Further, the above printing method (3) is unsuperior in accuracy and light resistance. On the contrary, the above electro-deposition method (4) is advantageous since the resultant filter has good light resistance and high heat resistance. However, according to the method (4), the resultant filter needs a transparent electrode for forming a coloring matter layer, and needs, on its surface, an electrode for driving a liquid crystal as is the same case with the above methods (1) to (3).

On the other hand, as a process for producing a color filter which is capable of forming a conductive coloring matter layer, Japanese Patent Application Laid-Open Gazette No. 63-243298 discloses a micellar disruption method which comprises forming a transparent electrode in a desired shape on an insulating substrate, and forming a porous hydrophobic coloring matter film on the electrode by a micellar disruption method.

Recently, a light-shielding film is indispensable to make a display device such as a color filter, a liquid crystal display material, an electron display material, and a color display. These display devices have widely been used in several fields such as a lap-top personal computer, a note type personal computer, an audio equipment, an inside panel for an automotive, a clock, a calculator, a video cassette deck, a facsimile, a communication equipment, a game machine and a measurement equipment.

For example, in the fields of a color filter, a light-shielding film is used as a black matrix to be formed between each of picture elements such as red (R), green (G) and blue (B). Such black matrix is used to avoid lowering contrast and color purity due to leaked light.

Heretofore, in the case of forming each picture element (coloring matter layer) such as a color filter by a printing method, a dispersion method or a dyeing method, there have been used a carbon type photo-resist material and a chromium film in many cases.

However, the use of the carbon type photo-resist material or the chromium film cannot give an electrode for driving a liquid crystal and an electrode for forming a coloring matter film at the same time due to their conductivity. More specifically, when a black matrix is first formed, using the photo-resist material or the chromium film, on an ITO electrode on which a pattern was formed for forming a coloring matter layer, the ITO electrode will be electrically connected with a right and left side electrodes. Thus, a coloring matter layer cannot be formed by a micellar disruption method and the like. On the contrary, when a black matrix is formed after a coloring matter layer is formed, there will be a problem that a liquid crystal cannot work due to electrical connection between the ITO electrode and a right and left side electrodes during liquid crystal operation. Accordingly, the use of the carbon type photo-resist material results in a problem that a micellar disruption method and an electro-deposition method cannot be used to form a coloring matter layer.

Accordingly, it has been desired to develop a resist for a light-shielding film which has an insulating property. Thus, organic dye type photo-resist materials have been developed. The light-shielding film made from the conventional insulating organic dye type photo-resist material is formed by a photo-lithography method by mixing three kinds of photo-resists including dyes for red (R), green (G) and blue (B), or two kinds of photo-resists including dyes of red (R) and blue (B). Thus, the resultant light-shielding film has poor light-shielding ratio. To obtain a sufficient light-shielding ratio, it is necessary to make film thicker.

The present invention was made in view of the above situations, and has its object to provide a process for producing a color filter in which a transparent electrode can be used both for forming a coloring matter layer during the color filter preparation and for driving a liquid crystal after the color filter has been produced. Further, rt is another object of the present invention to provide a resist for a light-shielding film capable of forming a light-shielding film having an good insulating property and a high light-shielding ratio.

DISCLOSURE OF INVENTION

According to the present invention, there is provided a process for producing a color filter prepared by laminating an insulating substrate, a transparent electrode, a black matrix and a coloring matter layer in this order, and having, near one side of the color filter surface, an electrode contact zone composed of electrode contact window belts for each of the transparent electrodes corresponding to individual separated colors, said process comprising forming a black matrix over electrodes other than those corresponding to the individual separated colors and, at the same time, insulating layers as electrode contact window belts by utilizing the black matrix material; forming the electrode contact window belts by forming an electrically conductive layer over the black matrix so that the electrode contacts for one color connect with each other. within each electrode contact window belt unit, but do not connect with those for the other colors in different electrode contact window belt units; and forming a coloring matter layer by a micellar disruption method.

In the process for producing a color filter according to the present invention, an insulating black matrix and an electrode contact window belt for taking out an electrode in a part of a color filter are formed at the same time, and then a conductive coloring matter layer is laminated on a transparent electrode by a micellar disruption method. Thus, it is easy to produce a color filter in which an electrode for forming a coloring matter layer can be used also for driving a liquid crystal.

Further, the resists for light-shielding film of this invention include a resist for a light-shielding film comprising at least one of an insulating organic dye dispersed resist and an insulating transparent resist, and a conductive high light-shielding resist (first resist); a resist for light-shielding film comprising two or more kinds of insulating organic dye dispersed resists (second resist); and a resist for a light-shielding film composed of an insulating transparent resist containing a black organic dye dispersed therein (third resist). The resultant light-shielding film preferably has a surface resistance of not less than $10^7 \, \Omega/cm^2$.

In these figures, 1 denotes a glass substrate, 2 denotes a transparent electrode, 3 denotes a black stripe, 4 denotes a coloring matter, 5 denotes a coating layer and 6 denotes an orientation layer.

BEST MODE FOR CARRYING OUT THE INVENTION

The present invention will be described in more detail below.

In the process for producing a color filter according to the present invention, a black matrix is first formed over electrodes other than those corresponding to the individual separated colors. The material for the black matrix forms insulating layers as electrode contact window belts. Then, electrically conductive layers are formed on the matrix so that the electrodes connect within each electrode contact window belt unit, but do not connect with those in different electrode contact window belt units. Then the coloring matter layer is formed by the micellar disruption method.

Figure 1:
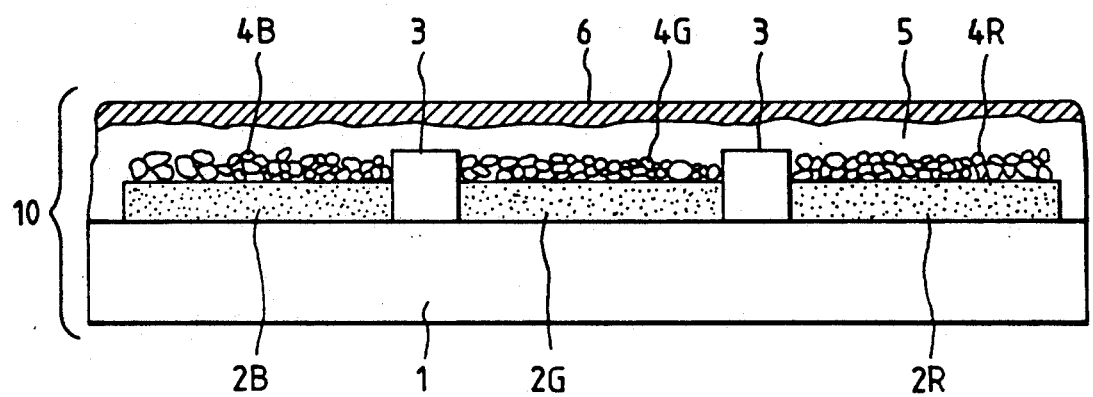
FIG. 1 is a schematic cross-sectional view of one example of the color filter according to the present invention.

One of the embodiments will be described with reference to FIG. 1. To produce a color filter 10, firstly, a surface of an insulating glass substrate 1 (for example, plates of blue plate glass, non-alkali glass and quartz glass) is sufficiently washed with an alkali aqueous solution or pure water.

Figure 2:
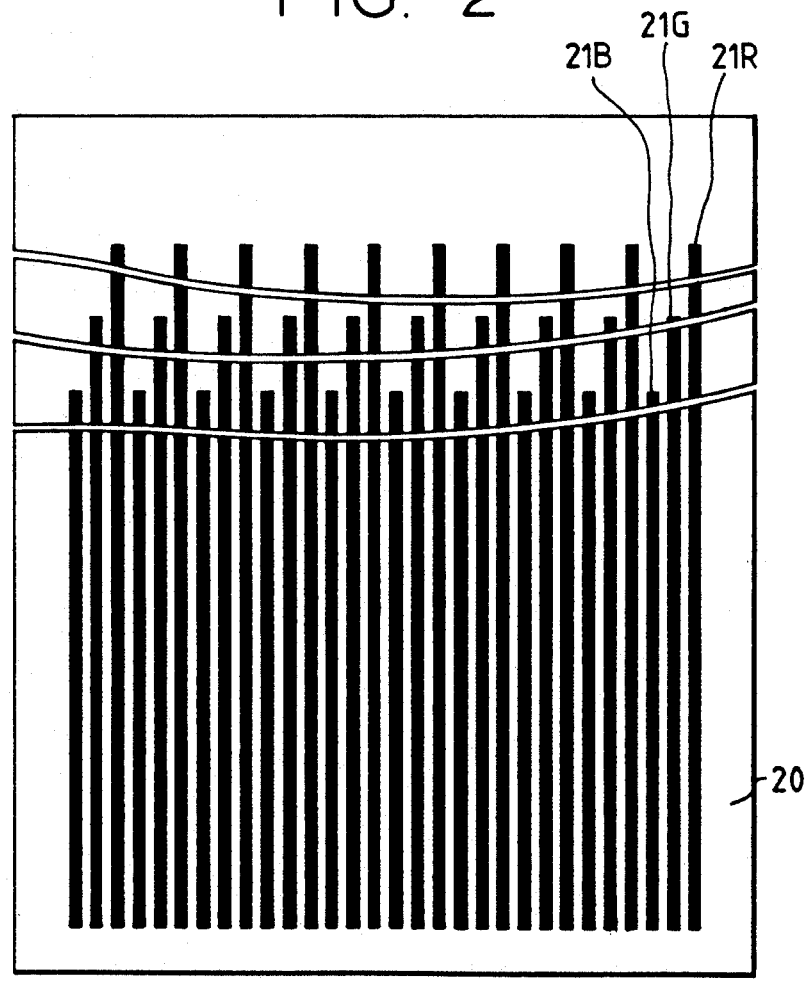
FIG. 2 is a plan view showing a mask for forming a transparent electrode.

Then, a transparent electrode material layer is formed on one side of the glass substrate 1 by way of a vapor deposition method, a sputtering method, a bio-sol method, a ultra small particle casting method or the like. The electrode material layer is subjected to surface oxidation treatment or baking treatment to adjust resistance. Then, a resist material (such as UV curable resin) is coated on the electrode material layer by a spin coating method, a dipping method or a casting method. The coated substrate is subjected to exposure treatment (for example, UV exposure) using a suitable mask, and the unexposed portions of the resist material are washed and removed after development. The exposed and remaining resist material is cured, and the exposed electrode material is subjected to etching treatment with an etching liquid and is removed. Then, the cured and remaining resist is also removed. The treated substrate is washed and transparent electrodes 2 (2B, 2G, 2R) corresponding to each of the primary colors are formed. Then, a black matrix or stripe 3 is formed on the glass substrate 1 carrying the transparent electrodes 2 by a photo-lithography method as described in detail below. For example, the resist for a light-shielding film of the present invention such as a resist material consisting of a UV curable resin and a black dye is coated on the substrate with a spin coater or a roll coater. The resist is subjected to exposure treatment with a suitable mask for a black stripe, followed by usual procedures including washing, development, washing and baking. The mask 20, as shown in FIG. 2, is for a positive resist. Since the UV curable resin is a negative resist, a proper mask which can be used for the process mentioned in this paragraph should be a mask whose light shielding and passing sections are reversed from those of the mask 20 shown in FIG. 2.

If a mask for a transparent electrode and a mask for a black matrix are appropriately selected, electrode contact window belts can be formed in a part of a color filter simultaneously with formation of a black matrix. For example, when transparent electrodes are formed on a glass substrate using the mask 20, ten repeating units of electrode lines, each consisting of three electrode lines (shortest line 2B, medium size line 2G, longest line 2R), are formed so that electrode lines 2B, 2G and 2R respectively correspond to these lines 21B, 21G and 21R for the three primary colors of a light, blue (B), green (G) and red (R).

Figure 3:
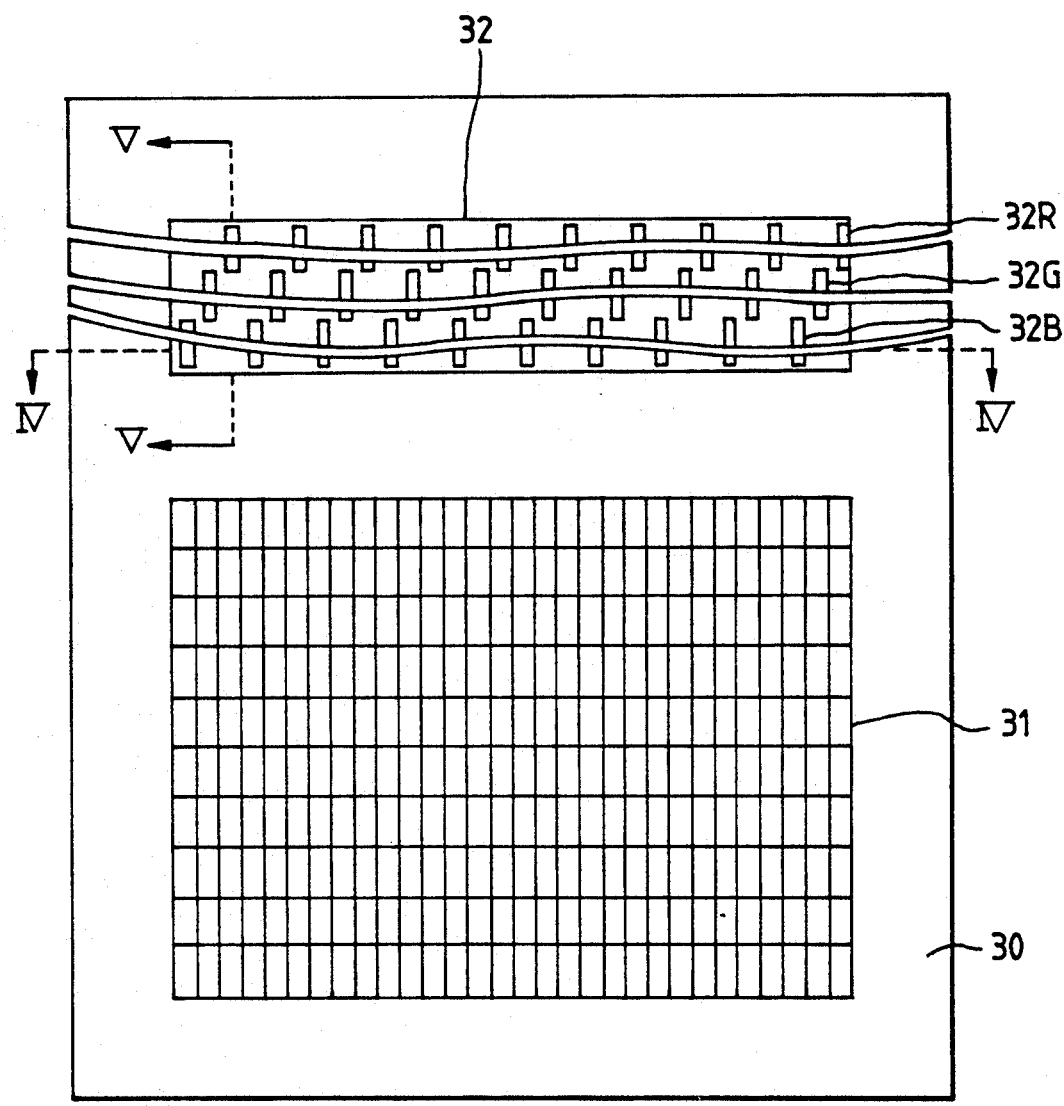
FIG. 3 is a plan view showing a mask for forming a black matrix and an electrode contact zone.

A black matrix is formed using, for example, a mask 30 as shown in FIG. 3. The mask 30 has a pattern 32 for forming electrode contact zones as well as a pattern 31 for forming a black matrix. A pattern 32 is composed of patterns for forming three electrode contact window belts, which consist of a pattern 32B for forming an electrode contact window belt for an electrode line (B); a pattern 32G for forming an electrode contact window belt for an electrode line (G); and a pattern 32R for forming an electrode contact window belt for an electrode line (R). It is preferable to use the resist for a light-shielding film according to the present invention to form a black matrix and an insulating layer at the same time.

Figure 4:
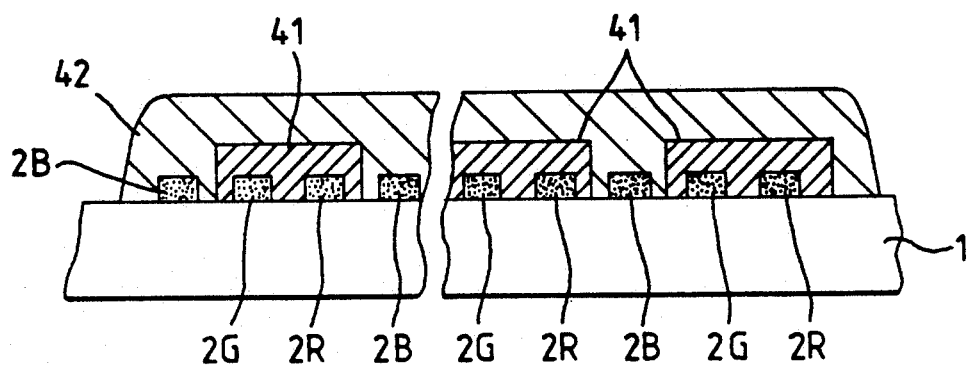
FIGS. 4 and 5 are cross-sectional views of an electrode contact zone.
Figure 5:
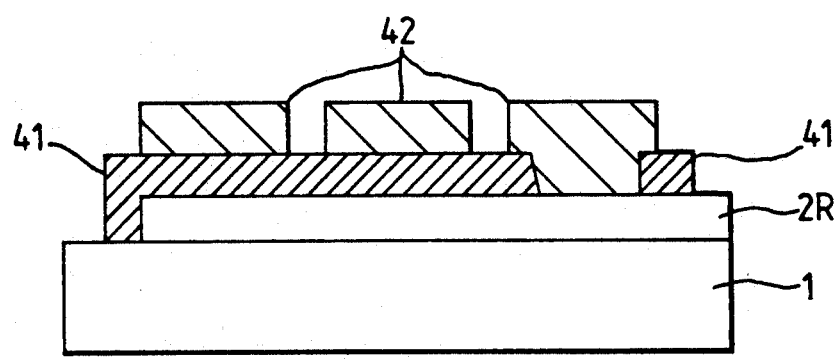

Sections of electrode contact zones of a color filter prepared by using the mask 20 and the mask 30 are shown in FIGS. 4 and 5. FIG. 4 is a cross-sectional view, taken along line IV-IV in the mask 30, of a color filter; and FIG. 5 is a cross-sectional view, taken along line V-V in the mask 30, of a color filter. As shown in FIGS. 4 and 5, the electrode lines 2G and 2R are coated with an insulating layer 41, but the electrode lines 2B are electrically connected with each other through a conductive layer 42.

The resist for a light-shielding film according to the present invention suitably used for forming the above black matrix, will be described in detail below.

The first resist of the present invention comprises at least one of an insulating organic dye dispersed resist and an insulating transparent resist, and a conductive high light-shielding resist.

The insulating organic dye dispersed resists include, for example, a resist in which an insulating organic dye is dispersed, such as an acryl type resist, an epoxy type resist and a polyimide type resist.

The insulating organic dyes include, for example, perylene type dyes, anthraquinone type dyes, dianthraquinone dyes, azo type dyes, diazo type dyes, quinacridone type dyes, and anthracene type dyes. More specifically, examples of the insulating organic dyes are a perylene dye, quinacridone, Naphthol AS, a shikonin dye, dianthraquinone, Sudan I, II, III or R/ bisazo, and benzopyran.

The blue dyes include, for example, phthalocyanine type dyes, copper phthalocyanine type dyes, indathrone type dyes, indophenol type dyes and cyanine type dyes. More specifically, examples of the blue dyes are metal complexes of phthalocyanine such as chlorinated copper phthalocyanine, chlorinated aluminum phthalocyanine, vanadic acid phthalocyanine, magnesium phthalocyanine, zinc phthalocyanine, iron phthalocyanine, cobalt phthalocyanine; phthalocyanine; merocyanine; and indophenol blue.

Further, as commercially available insulating organic dye dispersed resists, organic dye dispersed resist containing a yellow (Y) organic dye, a violet (V) organic dye and the like (Color Mosaic CR, CG, CB, CY, CV, etc.; Manufactured by Fuji Hunt Technology, Co.) are available in addition to resists containing a red (R), green (G) or blue (B) organic dye.

The insulating transparent resists include any transparent resists having an insulating property, for example, UV curable resists. More specifically, the insulating resists include ALONIX (acryl type resin; Manufactured by Toa Gosei, Co.); and TORAY PHOTONIS (Manufactured by Toray, Co.)

The conductive resists having a high light-shielding property include, for example, a conductive particle dispersed resists which are those resists containing conductive particles dispersed in a acryl type resist, an epoxy type resist and a polyimide type resist. In this case, examples of the conductive particles are high light-shielding materials such as carbon, chromium oxide and small metal particles.

The first resist containing the above resists (insulating organic dye dispersed resist, insulating transparent resist, conductive high light-shielding resist), are usually prepared by mixing the above resists. Further, for instance, the first resist can be prepared by dispersing insulating organic dye and conductive high light shielding particles in one of the resist materials. In any preparation methods, it is preferable to mix each dye and conductive particles with a resist so that they are uniformly dispersed in the resist material.

The mixing ratio can be selected appropriately. However, in the case of using a micellar disruption method, it is preferable to select the mixing ratio so that resultant light-shielding film has a surface resistance of $10^7$ $\Omega/cm^2$ or more. At the time of mixing, a solvent can be added. A mixing equipment which can avoid heat generation, is preferably used to prevent resists from being aggregated.

The second resist comprises at least two kinds of insulating organic dye dispersed resist. The above description for the first resist can be applied to the insulating organic dye dispersed resists for the second resists.

The preparation methods include, for example, a method comprising mixing two kinds of photo-resist materials, each having one color dye different from each other; and a method comprising mixing two dyes (two colors) with one of resist materials and then dispersing the dyes in the resist material. In any methods, it is preferable to mix the dyes with the resist material so that each dye can be uniformly dispersed in the resist material.

The above description about the mixing ratio, the surface resistance and the like can be also applied to the second resist.

The third resist is an insulating transparent resist containing a black organic dye dispersed therein. The above description about the insulating transparent resins can also be applied to the third resist.

The black organic dyes include, for example, Perilene Black, Aniline Black, and Cyanine Black. Two or more kinds of the black organic dyes can be dispersed in the insulating transparent resist. It is preferable that the black organic dye be uniformly dispersed in the resist.

In addition, the first, second and third resists can be positive type or negative type UV curable resists, and can be EB resists, X-ray resists and the like.

In the practice of the production of the color filter according to the present invention, it is preferable to use the above first, second or third resist to form a black matrix with the use of a photo-lithography method.

Figure 6:
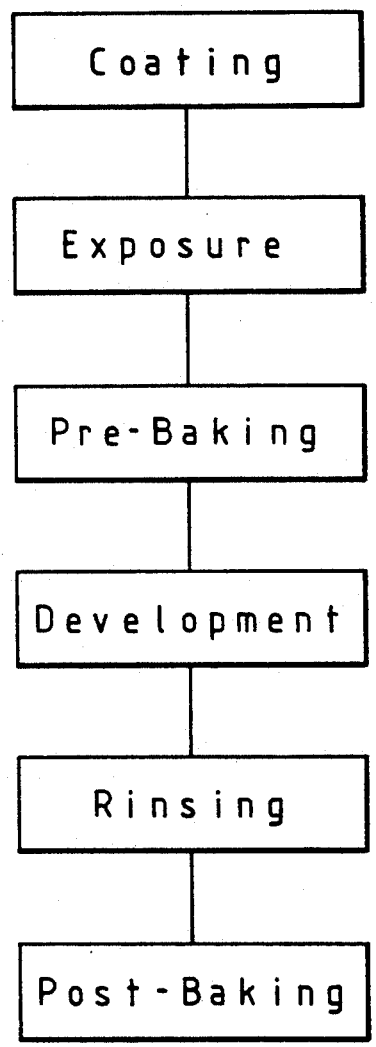
FIG. 6 is a flow chart showing one example of production steps of a light-shielding film by way of a photo-lithography method.

FIG. 6 is a flow chart showing steps of production of a light-shielding film by way of a photo-lithography method.

(1) Firstly, any one of the above first, second and third resists is coated on a substrate made of glass and the like. The coating methods include coating using a spin coater or a roll coater; and spray coating using a compressor. The rotation speed for a spin coater or a roll coater can be selected appropriately depending upon viscosity of a resist, desired film thickness, and the like, and may range, for example, from 500 to 3,000 rpm.

(2) The substrate coated with the resist for a light-shielding film is then subjected to exposure treatment. The exposure is conducted with an exposing equipment using a photo-mask having a desired pattern. By the use of the photo-mask, a portion of a resist corresponding to the pattern of the photo-mask is exposed to light. The exposing equipment and the exposing conditions can be selected appropriately, and cannot be specifically limited. The amount of exposure may range, for example, from 20 to 200 mI/cm$^2$.

Further, a source of light is determined depending upon photo-sensitivity of a resist for a light-shielding film. For example, a 2KW high voltage mercury lamp can be used.

(3) After exposure, pre-baking is carried out. The pre-baking is carried out for the purpose of increasing adhesiveness between a substrate and a resist for a light-shielding film before development, resulting in prevention of deficiencies during development.

The pre-baking is conducted by heating with an oven, a hot plate and the like. The pre-baking temperature and heating time can be selected appropriately depending upon the resist used. The pre-baking temperature and time may range, for example, from 85° to 100° C. and from 5 to 10 minutes, respectively.

(4) After pre-baking development is carried out. The development is carried out for the purpose of removing an unexposed portion of a resist (in the case of negative resist) or an exposed portion of a resist (in the case of positive resist). The development forms a desired pattern on the substrate. A developing liquid can be preferably selected from those capable of dissolving and removing a resist, depending upon the content of the resist used. An appropriate development liquid is commercially available for each commercial resist material. Thus, such commercial products can be used, however alkali aqueous solution is mainly used.

The concentration of the developing liquid and development time can be appropriately selected depending upon the resist to be used and the developing liquid used. The development time may range, for example, from 20 to 30 seconds.

(5) After development, the obtained substrate is rinsed by immersing it in a pure water. The rinsing is carried out to remove the developing liquid.

(6) After rinsing, post-baking is carried out. The post-baking is carried out, for example, to improve adhesiveness between the resist for a light-shielding film and the substrate. The post-baking is conducted as is the same case with the pre-baking, by heating with an oven, a hot plate and the like. The post-baking temperature and time may range, for example, from 200° to 220° C. and from 5 to 10 minutes, respectively.

In the process of the present invention, after the above-mentioned black matrix is formed, a coloring matter layer consisting of conductive porous and hydrophobic coloring matter thin film, is formed on a transparent electrode by way of a micelle-electrolytic method. The phrase "conductive porous film" means that the film or layer is porous so as to have enough conductance. In other words, the film or layer has conductance to extent that a transparent electrode located under the film or layer can be used for driving a liquid crystal and the like. Thus, the material itself of the film or layer needs not to be conductive.

To form the above coloring matter thin film by a micellar disruption method, the following procedures can be used.

A micelle forming agent comprising ferrocene derivatives and a coloring matter material (hydrophobic coloring matter) are added to an aqueous solvent having a controlled conductance prepared by adding, as necessary, a support electrolyte to water. The mixture is well stirred to obtain a micelle containing the coloring matter material therein. When the micelle solution is subjected to electrolytic treatment, the micelle moves to an anode. The ferrocene derivative contained in the micelle loses an electron, $e^-$ ($Fe^{2+}$ of the ferrocene is oxidized to $Fe^{3+}$) on the anode (transparent electrode), and at the same time the micelle is broken. When the micelle is broken, a coloring matter material is precipitated on the anode to form a thin film.

On the other hand, the oxidized ferrocene derivative moves to a cathode and receives an electron, $e^-$ to reform a micelle. While the micelle formation and breakage are repeated, coloring matter particles are precipitated on the transparent electrode to form a thin film. The desired coloring matter thin film is formed in this manner. The thus obtained coloring matter thin film has, in general, a thickness of 0.1 to 10.0 μm, preferably 0.1 to 2.0 μm. Due to the porous structure of the thin film, the thin film has high conductance. If the film thickness is less than 0.1 μm, the hue of the coloring matter layer cannot sufficiently be exhibited. If the thickness is more than 10.0 μm, the film will have low conductance. Thus, the thin film having the above thickness range is preferable.

The micelle forming agents which can be used in a micellar disruption method are those comprising ferrocene derivatives. The ferrocene derivatives include several types, and may be those represented by the general formula [I]:

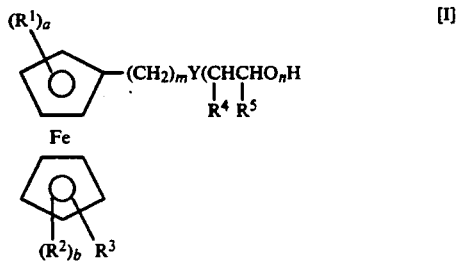

wherein $R^1$ and $R^2$ are independently a $C_{1-6}$ alkyl group, $C_{1-6}$ alkoxy group, amino group, dimethylamino group, hydroxyl group, acetylamino group, carboxyl group, methoxycarbonyl group, acetoxy group, aldehyde group or halogen; $R^3$ is hydrogen or a linear or branched $C_{4-18}$ alkyl group or alkenyl group; $R^4$ and $R^5$ are independently hydrogen or a methyl group; Y is oxygen, an oxycarbonyl group or acyloxy group; a is an integer of 0 to 4; b is an integer of 0 to 4; m is an integer of 1 to 18; and n is a real number of 2.0 to 70.0.

These compounds are described in, for example, PCT International Publication for WO 88/07538 and WO 89/01939, and a patent specification of JP Patent Appln. No. 63-233797.

In $R^1$ and $R^2$, the $C_{1-6}$ alkyl groups include a methyl group ($CH_3$) and ethyl group ($C_2H_5$); the alkoxy groups include a methoxy group ($OCH_3$) and ethoxy group ($OC_2H_5$); halogen includes chlorine, bromine, fluorine and iodine. $R^1$ and $R^2$ may be the same as or different from each other. Further, when $R^1$ and $R^2$ independently exist in a plurality of five-membered rings of the ferrocene, a plurality of substituted groups may be the same as or different from each other. In addition,

in the general formula [I] include, for example,

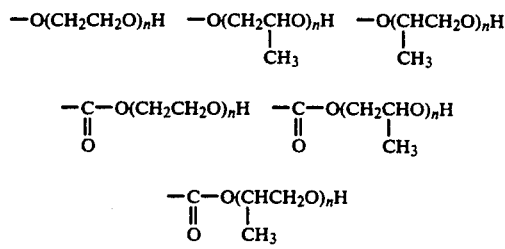

Further, n means a number of a repeating unit which is the above oxyalkylene group. The number "n" includes a real number of the repeated oxyalkylene group (thus means average number) as well as an integer of 2.0 to 70.0. The ferrocene derivatives which can be used in the micellar disruption method include several ones in addition to those represented by the general formula [I]. Such ferrocene derivatives include ammonium type, pyridine type (PCT International Publication WO 88/07538, etc.) and those described in patent specifications of JP Patent Appln. Nos. 53-233797; 63-233798; 63-248660; 63-248601; Hei 1-45370; Hei 1-54956; Hei 1-70680; Hei 1-10681; Hei 1-76498; and Hei 1-76499.

These ferrocene derivatives are capable of effectively dissolving or dispersing hydrophobic substances in an aqueous medium.

In the micellar disruption method used in the present invention, a micelle forming agent comprising a ferrocene derivative, a supporting salt, and a hydrophobic organic substance are placed in an aqueous medium and thoroughly dispersed by the use of supersonic waves, a homogenizer, or a stirrer to from a micelle. Thereafter, if necessary, an excessive coloring matter material is removed. The micelle solution thus obtained is subjected to electrolytic treatment using the transparent electrode while allowing to stand or somewhat stirring. During the electrolytic treatment, the coloring matter material may be supplementarily added to the micelle solution, or there may be provided a recycle circuit in which the micelle solution in the vicinity of the anode is withdrawn out of the system. The coloring matter material is added to the withdrawn micelle solution and thoroughly stirred, and then the resulting solution is returned to the vicinity of the anode. In this case, the concentration of micelle forming agent may be at least the critical micelle concentration, more specifically about 0.1 mM or more. The concentration of the coloring matter material may be saturated concentration or higher.

Electrolytic conditions are determined appropriately depending on various circumstances. Usually, the liquid temperature is 0° to 70° C., preferably 5° to 40° C. The voltage is not less than oxidation-reduction potential of the ferrocene derivative as micelle forming agent, but not greater than hydrogen generation potential, and more specifically is 0.03 to 1.00V, preferably 0.15 to 0.7 V. The current density is not more than 10 mA/cm$^2$, preferably 50 to 300 A/cm$^2$.

On performing this electrolytic treatment, the reaction proceeds in accordance with the principle of the micellar disruption method. Explaining in connection with the behavior of Fe ion in the ferrocene derivative, $Fe^{2+}$ is converted into $Fe^{3+}$ on an anode, leading to the breakdown of the micelle. Particles of a coloring matter material are deposited on the anode. On the other hand, on a cathode, $Fe^{3+}$ oxidized on the anode is reduced to $Fe^{2+}$, recovering the original micelle and, therefore, a film forming operation can be carried out repeatedly using the same solution.

Electrolytic treatment as described above forms a thin film composed of the desired coloring matter material on the anode.

The supporting salt (supporting electrolyte) to be used in the process of the present invention is added, if necessary, in order to control the electrical conductance of the aqueous medium. The amount of the supporting salt added is such that the precipitation of coloring matter material dissolved or dispersed is not prevented, and is usually about 0 to 300 times, preferably about 50 to 200 times that of the above micelle forming agents. It is possible to perform the electrolytic treatment without using the supporting salt. In this case, highly pure thin film containing no supporting salt is obtained. The type of the supporting salt is not critical as long as capable to control the electric conductance of the aqueous medium without inhibiting the formation of the micelle and the deposition of the above coloring matter material.

More specifically, the supporting salts which have widely been used include, for example, sulfuric acid salts (salts of lithium, potassium, sodium, rubidium, aluminum and the like); acetic acid salts (salts of lithium, potassium, sodium, rubidium, beryllium, magnesium, calcium, strontium, barium, aluminum and the like); salts of halogenated compounds (salts of lithium, potassium, sodium, rubidium, magnesium, calcium, aluminum and the like); and water-soluble oxide salts (salts of lithium, potassium, sodium, rubidium, magnesium, calcium, aluminum and the like).

The electrode to be used in the process of the present invention is sufficient to be a metal more noble than the oxidation potential (against +0.15V to 0.30V saturated calomel electrode) of ferrocene, or an electrically conductive substance. More specifically, ITO (mixed oxide of indium oxide and tin oxide), tin oxide, electrically conductive organic polymers, and the like can be used.

In the production process of the present invention, the coloring matter materials for forming a coloring matter film include several ones including those exhibiting the three primary colors for light, such as a hydrophobic coloring matter material for red, green or blue. The red coloring matter materials include, for example, perylene type dyes, lake dyes, azo type dyes, quinacridone type dyes, anthraquinone type dyes and anthracene type dyes, and more specifically include a perylene dye, lake dyes (Ca, Ba, Sr, Mn), quinacridone, Naphthol AS, a shikonin dye, dianthraquinone, Sudan I, II, III or R, bisazo, and benzopyran, cadmium sulfide type dyes, Fe (III) oxide type dyes. Of these, the perylene dye and the lake dye are preferred.

The green coloring matter materials include, for example, halogenated multi-substituted phthalocyanine type dyes, halogenated multi-substituted copper phthalocyanine type dyes and triphenylmethane type basic dyes, and more specifically include chlorinated multi-substituted phthalocyanine, its copper complex and a barium-triphenylmethane dye. Further, the blue coloring matter materials include, for example, copper phthalocyanine type dyes, indathrone type dyes, indophenol type dyes and cyanine type dyes, and more specifically include metal complexes of phthalocyanine such as chlorinated copper phthalocyanine, chlorinated aluminum phthalocyanine, vanadic acid phthalocyanine, magnesium phthalocyanine, zinc phthalocyanine, iron phthalocyanine, cobalt phthalocyanine; phthalocyanine; merocyanine; and indophenol blue.

In the present invention, in the case of preparing hydrophobic coloring matter thin film for the three primary colors, any one of red, green and blue hydrophobic coloring matters is first added to an aqueous medium, and the first desired color thin film is formed by the above-mentioned micellar disruption method. Then, the micelle electrolytic treatment is repeatedly carried out using different hydrophobic coloring matter to form coloring matter films for the three primary colors (red, green, blue) on each transparent electrode.

In addition, it is possible to get hydrophobic coloring matters for red, green and blue dispersed in an aqueous medium at the same time, and subject the aqueous medium to the micelle electrolytic treatment to produce the same color filter.

Further, if necessary, a top coating material may be coated with a spin coater or a roll coater on the coloring matter layer and a black matrix and dried at 80° to 150° C. for 5 to 60 minutes to form a conductive coating layer. The top coating material include, for example, an acryl resin, polyether resin, polyester resin, polyolefin resin, phosphazene resin, or polyphenylene sulfide resin. The coating layer allows a surface to be contacted with a liquid crystal to be flat. If the coating layer is prepared from a conductive material, voltage down due to the coating layer can be prevented. Further, transparent conductive particles such as ITO particles can be added to these coating materials.

At the last, if necessary, an orientation layer as the most upper layer may be formed by coating, for example, a polyamic acid monomer, a polyimide resin oligomer or the like by a spin coater or a roll coater, polymerizing the coated material at 200° to 300° C. for 30 minutes to 2 hours, washing with pure water or the like, and drying the polymerized product (at 60° to 100° C. for 30 minutes to 2 hours or by UV radiation or the like). The liquid crystals can be oriented by the orientation layer.

The present invention will be described with reference to the following examples, which are not intended to limit the scope of the invention.

EXAMPLE 1

Formation of Transparent ITO Electrode

A glass substrate (NA45; Manufactured by HOYA; size 320×300×0.5 mm) was washed with 0.1N NaOH, and washed with pure water until the liquid resistance of the used water became $10^7$ $\Omega/cm^2$. The washed substrate was placed in a vacuum sputtering equipment and then subjected to sputtering treatment using ITO. The surface of the thus formed ITO layer was oxidized in air at 100° C. to adjust the surface resistance to 100 $\Omega/cm^2$. And then, a resist material (FH-2130; Manufactured by Fuji Hunt Electronics Technology, Co.) was coated over the ITO layer with a roller coater, baked at 80° C. for 5 minutes, subjected to UV radiation (60 seconds) with a 500W high pressure mercury lamp using a stripe mask as shown in FIG. 2. In addition, width of each line of the mask as shown in FIG. 2 was 90 μm, and distance between each line was 20 μm.

And then, the obtained product was washed with water, and the ITO coated with the resist material was immersed in a developing liquid (HPRD-410; Manufactured by Fuji Hunt Technology, Co.), and then developed for 5 minutes. Further, the obtained product was washed with pure water and then heated to 230° C. for 5 minutes. After sufficiently curing the resist material, the product was immersed in 1N.HCl/1M.FeCl$_3$ etching liquid to subject the ITO to etching treatment for 20 minutes. After etching, the product was washed with pure water, and the cured resist was removed with the use of a resist removing agent (Microstrip 2001; Manufactured by Fuji Hunt Technology, Co.). Then the product was further washed.

Formation of Black Stripe

A resist film was formed on the ITO carried substrate as prepared above, by coating a color resist containing a UV curable polymer and a black dye (Color Resist CK; Manufactured by Fuji Hunt Electronics Technology, Co.) by a spin coating at 3,000 rpm. The coated substrate was pre-baked at 80° C. for 5 minutes, and further coated with polyvinyl alcohol as oxygen resist material by spin coating at 400 rpm. After that, the resist material was pre-baked at 80° C. for 5 minutes, and subjected to UV radiation with a 500W high pressure mercury lamp using a mask for black stripe as shown in FIG. 3. In addition, the mask of FIG. 3 had a pattern for a black stripe having an inner size of 90×310 μm, a line width of 20 μm, and a pattern for electrode contact windows having an inner size of 90 μm×5 mm. After washing with water, the resist was developed using a color resist developing liquid (CD; Manufactured by Fuji Hunt Electronics Technology, Co.) The thus obtained product was washed with pure water, and then post-baked at 230° C. for 10 minutes. In this manner, the black stripe and the electrode contact window for each electrode line corresponding to each of the three primary colors, were formed at the same time. And then, three electrode contact window belts were formed by coating conductive silver paste in the shape of belts so that the electrode lines for the same color were electrically connected, but the electrode lines for different colors were not connected.

Formation of coloring Matter Layer

From one to two grams of each of a red dye (Lithol Scarlet K3700; Manufactured by BASF), a green dye (Heliogen Green L9361; Manufactured by BASF); and a blue dye (Heliogen Blue B7080; Manufactured by BASF) was added to and dispersed in a 2 mM aqueous solution of a compound (FPEG) represented by the following formula:

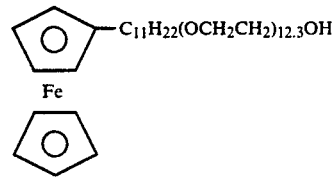

Further, 0.1M of lithium bromide (supporting salt) was added to and dispersed in the mixture with a ultrasonic homogenizer for 30 minutes, and the mixture was stirred with a stirrer for 3 days to prepare coloring matter dispersed solutions.

The substrate obtained as above was immersed in the red dye dispersed solution (an electrode contact zone was not immersed), and then micelle electrolytic treatment (0.5V, 25° C., 30 minutes) was carried out using an electrode contact window belt for an electrode line for a red coloring matter. A saturated calomel electrode as reference electrode and an aluminum plate as cathode were used. After the electrolytic treatment, the substrate was washed with pure water, baked at 180° C. for 1 hour to obtain a red coloring matter layer 4R.

Following the same procedures, a green coloring matter layer 4G and a blue coloring matter layer 4B were formed.

The average film thickness of each coloring matter layer was 0.5 μm (red), 0.4 μm (green) and 0.6 μm (blue), respectively.

Formation of Coating Layer and Orientation Layer

The obtained substrate was coated with a top coating material (OPTOMAR JHR; Manufacture by Nippon Synthetic Rubber) by spin coating at 3,000 rpm, and baked at 80° C. The thus coated substrate was further coated with a N-methylpyrrolidone solution of polyamic acid by spin coating in the same manner, and the coated polyamic acid was polymerized under vacuum atmosphere at 250° C. for 1 hour. After washing with pure water, the washed substrate was dried at 80° C. for 1 hour to obtain a color filter of the present invention having a conductive coating layer 5 (0.2 μm) and an orientation layer 6 (0.1 μm).

Further, the color filter was subjected to sputtering treatment using ITO to form the ITO layer on the oriented layer 6. The resistance between this ITO and the ITO formed inside of the color filter was measured by a tester, and the resistance was $10^5$ $\Omega cm^2$. The insulating resistance between the ITOs was $10^{13}$ $\Omega/cm^2$. Thus, it was confirmed that the an electrically conductive color filter was formed.

EXAMPLE 2

Formation of Transparent ITO Electrode

A glass substrate (NA45; Manufactured by HOYA; size 300×300 mm) having a surface resistance of 20 $\Omega/cm^2$ as an ITO film was coated with a 50% xylene solution of a UV curable resist material (IC-28/T3; Manufactured by Fuji Hunt Electronics Technology) by spin coating at 1000 rpm. After spin coating, the coated substrate was pre-baked at 80° C. for 15 minutes. And then, this resist/ITO substrate was placed in an exposing equipment.

A mask used had a stripe pattern having a. line width of 100 μm, a gap of 20 μm and a line length of 155 μm. A 2KW high voltage mercury lamp (exposure ability: 10 mW/cm$^2$.s) was used. The proximity gap was set as 70 μm. After 60 second exposure, the resist was developed with a developing liquid. After development, the treated product was rinsed with pure water, and post-baked at 180° C. And then, the product was subjected to etching treatment using an etching liquid consisting of 1M FeCl$_3$, 1N HCl, 0.1N HNO$_3$, 0.1N Ce(NO$_3$)$_4$. The etching treatment took 40 minutes. After etching, the product was washed with pure water, and the resist was removed by the use of 1N NaOH.

Following the above procedures, the ITO electrode in the shape of strip was formed on the glass substrate.

Formation of Resist for Light-Shielding Film and Black Stripe

There was used a resist for a light-shielding film (resist for forming a black matrix) prepared by mixing a conductive high light-shielding resist (CK; Manufactured by Fuji Hunt Electronics Technology) and an insulating transparent resist (acryl type resist cellosolve acetate 10% solution; Manufactured by Toa Gosei) at a conductive resist/insulating resist ratio, by weight, of 3:1.

While the ITO patterning substrate as prepared above was rotated at 10 rpm, 30 cc of the above resist for a light-shielding film was sprayed thereon. Then, the substrate was subjected to spin coating at 2500 rpm to form an uniform film. The coated substrate was pre-baked at 80° C. for 15 minutes. The obtained product was subjected to exposure by an exposing machine having a 2kW high pressure mercury lamp and an alignment function, using a photo-mask for forming a black matrix pattern, while positioning the product. After that, the resist was developed using a color resist developing liquid (CD; diluted 4 times; Manufactured by Fuji Hunt Electronics Technology, Co.) for 30 seconds. The thus obtained product was rinsed with pure water, and then post-baked at 200° C. for 100 minutes. In this manner, the black stripe and the electrode contact window for each electrode line corresponding to each of the three primary colors, were formed at the same time.

Formation of Coloring Matter Layer

A micelle solution was prepared by adding a micelle forming age of a ferrocene derivative (Manufactured by Dohjin Chemical), LiBr (Manufactured by Wako Pure Chemical) and CROMOPHTHAL A2B (Manufactured by Chiba-Geigy) to 4L of pure water to prepare 2 mM/l solution, 0.1M/l solution and 10 g/l solution. The obtained solutions were stirred with a ultrasonic homogenizer for 30 minutes to obtain micelle solutions. The substrate prepared as above was immersed in the micelle solution (an electrode contact zone was not immersed). A red coloring matter layer for a color filter was formed by connecting an electrode line for a red coloring matter (stripe R) with a potentiostat, and carrying out constant potential electrolytic treatment at 0.5V. After the electrolytic treatment, the obtained product was washed with pure water, and pre-baked with an over at 180° C.

Following the same procedures, a green coloring matter layer and a blue coloring matter layer were formed in this order, using a green dye (Heliogen Green L9361; Manufactured by BASF), and a blue dye (Heliogen Blue B7080; Manufactured by BASF), respectively.

The black stripe of the thus obtained color filter had a film thickness of 1.7 μm, a light-shielding ratio of 92% and a surface resistance of $10^9$ $\Omega/cm^2$.

The color filter was produced in such a way that the formed RGB filter had a thickness within 0.6 to 1.0 μm and had a relatively flat surface, and that the thin film was not formed on the electrodes other than those for passing electricity. In addition, it was found that the color filter had a resistance of $10^5$ $\Omega/cm^2$, and that the color filter was an electrically conductive one.

EXAMPLE 3

The same procedures as used in Example 2 were repeated except that there was used a resist for a light-shielding film prepared by mixing a conductive high light-shielding resist (CK; Manufactured by Fuji Hunt Electronics Technology), an insulating organic dye (red) dispersed resist (CR; Manufactured by Fuji Hunt Electronics Technology), an insulating organic dye (green) dispersed resist (CG; Manufactured by Fuji Hunt Electronics Technology), and an insulating organic dye (blue) dispersed resist (CB; Manufactured by Fuji Hunt Electronics Technology) at a CK/CR/CG/CB resist ratio, by weight, of 3:1:1:1, and that the rotation speed for spin coating was changed to 2000 rpm during black matrix formation, to produce a color filter.

As a result, the black matrix had a film thickness of 1.9 μm and a light-shielding ratio of 93% which was extremely high. The black matrix had a surface resistance of $10^{10}$ $\Omega/cm^2$. Thus, it was found that the color filter was produced without forming a thin film on the electrodes other than those for passing electricity. Also, it was found that the color filter was electrically conductive since the color filter had a resistance of $10^5$ $\Omega/cm^2$.

EXAMPLE 4

The same procedures as used in Example 2 were repeated except that there was used a resist for a light-shielding film prepared by mixing a conductive high light-shielding resist (CK; Manufactured by Fuji Hunt Electronics Technology), and an insulating transparent resist (acryl type resist ARONIX cellosolve acetate 10% solution; Manufactured by Toa Gosei) at a conductive resist/insulating resist ratio, by weight, of 1:1, and that the rotation speed for spin coating was changed to 1000 rpm during black matrix formation, to produce a color filter.

As a result, the black matrix had a film thickness of 2.3 μm and a light-shielding ratio of 99%. The black matrix had a surface resistance of $10^9$ $\Omega/cm^2$. Thus, it was found that the color filter was produced without forming a thin film on the electrodes other than those for passing electricity. Also, it was found that the color filter was electrically conductive since the color filter had a resistance of $10^5$ $\Omega/cm^2$.

EXAMPLE 5

The same procedures as used in Example 2 were repeated except that there was used a resist material for a light-shielding film prepared by mixing a conductive particle dispersed resist (containing chromium oxide as conductive particle); an insulating transparent resist (acryl type resist ARONIX cellosolve acetate 10% solution; Manufactured by Toa Gosei); an insulating organic dye (red) dispersed resist (CR; Manufactured by Fuji Hunt Electronics Technology) and an insulating organic dye (blue) dispersed resist (CB; Manufactured by Fuji Hunt Electronics Technology) at a weight ratio of 1:1.5:5:5, and that the rotation speed for spin coating was changed to 2000 rpm during black matrix formation, to produce a color filter.

As a result, the black matrix had a film thickness of 1.9 μm, and a light-shielding ratio of 97%. The black matrix had a surface resistance of $10^{13}$ $\Omega/cm^2$. Thus, it was found that the color filter was produced without forming a thin film on the electrodes other than those for passing electricity. Also, it was found that the color filter was electrically conductive since the color filter had a resistance of $10^5$ $\Omega/cm^2$.

EXAMPLE 6

The same procedures as used in Example 2 were repeated except that there was used a resist material for a light-shielding film prepared by mixing an insulating organic dye (red) dispersed resist (CR; Manufactured by Fuji Hunt Electronics Technology); an insulating organic dye (blue) dispersed resist (CB; Manufactured by Fuji Hunt Electronics Technology); an insulating organic dye (black) dispersed resist (K0084; containing Perillene Black; Manufactured by BASF); and an insulating transparent resist (acryl type resist ARONIX cellosolve acetate 10% solution; Manufactured by Toa Gosei) at a weight ratio of 15:15:30:40, and that the rotation speed for spin coating was changed to 2000 rpm during black matrix formation, to produce a color filter.

As a result, the black matrix had a film thickness of 1.9 μm, and a light-shielding ratio of 97%. The black matrix had a surface resistance of $10^{13}$ $\Omega/cm^2$. Thus, it was found that the color filter was produced without forming a thin film on the electrodes other than those for passing electricity. Also, it was found that the color filter was electrically conductive since the color filter had a resistance of $10^5$ $\Omega/cm^2$.

EXAMPLE 7

The same procedures as used in Example 2 were repeated except that there was used a resist material for a light-shielding film prepared by mixing an insulating organic dye (K0084; containing Perillene Black; Manufactured by BASF); and an insulating transparent resist (acryl type resist ARONIX cellosolve acetate 10% solution; Manufactured by Toa Gosei) at a weight ratio of 1:1.4, and dispersing the dye in the insulating transparent resist, and that the rotation speed for spin coating was changed to 2000 rpm during black matrix formation, to produce a color filter.

As a result, the black matrix had a film thickness of 1.9 μm, and a light-shielding ratio of 99%. The black matrix had a surface resistance of $10^{13}$ $\Omega/cm^2$. Thus, it was found that the color filter was produced without forming a thin film on the electrodes other than those for passing electricity. Also, it was found that the color filter was electrically conductive since the color filter had a resistance of 105 $\Omega/cm^2$.

EXAMPLE 8

The same procedures as used in Example 2 were repeated except that there was used a resist material for a light-shielding film prepared by mixing an insulating organic dye (K0084; containing Perillene Black; Manufactured by BASF); and an insulating transparent resist (Toray PHOTONEECE NMP 3% solution; Manufactured by Toray) at a weight ratio of 1:1.5, and dispersing the dye in the insulating transparent resist, and that the rotation speed for spin coating was changed to 2000 rpm during black matrix formation, to produce a color filter.

As a result, the black matrix had a film thickness of 1.9 μm, and a light-shielding ratio of 97%. The black matrix had a surface resistance of $10^{13}$ $\Omega/cm^2$. Thus, it was found that the color filter was produced without forming a thin film on the electrodes other than those for passing electricity. Also, it was found that the color filter was electrically conductive since the color filter had a resistance of 105 $\Omega/cm^2$.

EXAMPLE 9

The same procedures as used in Example 2 were repeated except that there was used a resist material for a light-shielding film prepared by mixing an insulating organic dye (red) dispersed resist (CR; Manufactured by Fuji Hunt Electronics Technology); an insulating organic dye (green) dispersed resist (CG; Manufactured by Fuji Hunt Electronics Technology); and an insulating organic dye (blue) dispersed resist (CB; Manufactured by Fuji Hunt Electronics Technology) at a weight ratio of 1.5:1:1, and that the rotation speed for spin coating was changed to 400 rpm during black matrix formation, to produce a color filter.

As a result, the black matrix had a film thickness of 2.9 μm, and a light-shielding ratio of 88%. The black matrix had a surface resistance of $10^{13}$ $\Omega/cm^2$. Thus, it was found that the color filter was produced without forming a thin film on the electrodes other than those for passing electricity. Also, it was found that the color filter was electrically conductive since the color filter had a resistance of 105 $\Omega/cm^2$.

COMPARATIVE EXAMPLE

The same procedures as used in Example 2 were repeated except that a conductive transparent resist (CK; Manufactured by Fuji Hunt Electronics Technology) was used as a resist material for a light-shielding film, to produce a color filter.

As a result, the black matrix had a film thickness of 2.4 μm, a light-shielding ratio of 99% and a surface resistance of $10^5$ $\Omega/cm^2$. Thus, a color filter could not be produced since a thin film was formed on the electrodes other than those for passing electricity during the formation of the first coloring matter layer.

INDUSTRIAL APPLICABILITY

As mentioned above, according to the present invention, a color filter can be readily produced, which enables a transparent electrode for forming a coloring matter film to be used as a transparent electrode for driving liquid crystals. In other words, since a coloring matter layer is extremely thin and porous, resulting in low potential resistance down effect of an electrode located under the coloring matter layer, the color filter can be used to directly drive liquid crystals. In the present invention, it is not necessary to form a transparent electrode on the most upper layer, resulting in omission of complicated positioning with an electrode. Further, the coloring matter layer prepared according to the present invention is superior to that prepared by a conventional method in conductance, heat resistance, chemical resistance, light resistance and the like. By the use of this coloring matter layer, the leveling is easy since the film thickness can be freely adjusted by controlling amount of electricity to be passed.

Accordingly, the color filters of the present invention can be used as several filters such as a liquid crystal display device, an electrochromic display device, a plasma display panel, spectrograph, CCP device, and a light controller. More specifically, the color filters can be effectively used in several fields such as a lap-top type personal computer, a word processor, a liquid crystal color TV (portable or wall hanging type), an aurora vision, a view finder for a video camera, a watch, a clock, a measurement equipment panel, an inner panel for an automotive, a liquid crystal color filter, a liquid crystal projector, a colored glass and the like.

Further, the resist for a light-shielding film according to the present invention has excellent properties such as a high insulating property and high light-shielding property. Accordingly, the use of the resist of the present invention gives a light-shielding film having light-shielding ratio which is 50% higher than that prepared using a conventional resist comprising three coloring materials (R, G, B), when comparing resists having the same thickness. Further, the present invention makes it possible to produce an RGB color filter by a micellar disruption method. Thus, after color filter is formed, an electrode for forming a color filter can be used as an electrode for driving liquid crystals. Furthermore, during the color filter preparation, a resist for a light-shielding film never bothers anything, and can divide small regions with walls of the resist for the light-shielding film. Thus, a production of a stable color filter having no exfoliation or spots, can be achieved.

We claim:

1. A process for producing a color filter, the color filter including an insulating substrate, transparent electrodes for a plurality of colors, a black matrix and a coloring matter layer, the color filter further including, near one side of the surface thereof, an electrode contact zone having an electrode contact window belt for each group of the transparent electrodes corresponding to each kind of color, the process comprising:
    (a) forming a lamination of an insulating substrate and patterned transparent electrodes laminated thereon for a plurality of colors, said lamination including an electrode contact zone having a plurality of units of electrode lines, each unit having a number of electrode lines equal and corresponding to the number of the colors;
    (b) forming a black matrix on said lamination, said black matrix having a surface resistance of not less than $10^7$ $\Omega/cm^2$;
    (c) simultaneously with the step of forming said black matrix, covering sections of said electrode contact zone with the material of said black matrix so that the material of said black matrix covers all electrode lines except a part of each electrode line for each color in each unit of electrode lines;
    (d) forming an electrically conductive layer in said electrode contact zone over said material of said black matrix and over the electrode lines for each color so that an electrode contact window belt unit is formed for each color and all of the electrode lines in one electrode contact window belt unit for one color are electrically connected with each other but insulated from the electrode lines in other electrode contact window belt units for the other colors, whereby all of the transparent electrodes for one color are electrically connected and the transparent electrodes for different colors are electrically insulated from each other; and
    (e) forming a porous coloring matter layer on said transparent electrodes by a micellar disruption method for one color at a time by selectively using said transparent electrodes.

2. A process according to claim 1, wherein said black matrix is formed by a photo-lithography method using a resist for a light-shielding film comprising at least one of an insulating organic dye dispersed resist and an insulating transparent resist, and a high light-shielding resist.

3. A process according to claim 1, wherein said black matrix is formed by a photo-lithography method using a resist for a light-shielding film comprising at least two kinds of insulating organic dye dispersed resists.

4. A process according to claim 1, wherein said black matrix is formed by a photo-lithography method using a resist for a light-shielding film which is an insulating transparent resist containing a black organic dye dispersed therein.

* * * * *